United States Patent
Lee

(10) Patent No.: US 7,471,709 B2
(45) Date of Patent: Dec. 30, 2008

(54) APPARATUS AND METHOD OF CONTROLLING EMISSION OF LASER BEAM

(75) Inventor: Jong-Min Lee, Seoul (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 0 days.

(21) Appl. No.: 11/390,253

(22) Filed: Mar. 28, 2006

(65) Prior Publication Data

US 2006/0255238 A1  Nov. 16, 2006

(30) Foreign Application Priority Data

May 10, 2005  (KR)  ...................... 10-2005-0039038

(51) Int. Cl.
*H01S 3/00* (2006.01)
(52) U.S. Cl. ............... 372/38.07; 372/38.02; 372/38.01
(58) Field of Classification Search .............. 372/38.07, 372/38.02, 38.1
See application file for complete search history.

(56) References Cited

U.S. PATENT DOCUMENTS

| | | | |
|---|---|---|---|
| 5,250,854 A | * | 10/1993 | Lien ........................... 327/530 |
| 5,583,621 A | * | 12/1996 | Narukawa .................... 399/58 |
| 6,350,978 B1 | | 2/2002 | Kasai |
| 6,549,265 B1 | | 4/2003 | Sakakibara et al. |
| 2002/0057721 A1 | * | 5/2002 | Taguchi et al. ................. 372/32 |

FOREIGN PATENT DOCUMENTS

| | | |
|---|---|---|
| JP | 07-266615 | 10/1995 |
| JP | 08-146828 | 6/1996 |
| JP | 2002-009390 | 1/2002 |
| JP | 2002-127501 | 5/2002 |
| JP | 2003-127460 | 5/2003 |

OTHER PUBLICATIONS

Korean Office Action dated Jul. 26, 2006 issued in KR 2005-39038.

* cited by examiner

*Primary Examiner*—Minsun Harvey
*Assistant Examiner*—Kinam Park
(74) *Attorney, Agent, or Firm*—Stanzione & Kim, LLP

(57) ABSTRACT

An apparatus and method of controlling emission of a laser beam in an image forming apparatus. The method includes generating a first reference voltage and a second reference voltage corresponding to a normal mode and a toner save mode, supplying one of the first reference voltage and the second reference voltage corresponding to a mode selection signal in a switching manner, generating a first control voltage and second control voltage to control emission of the laser beam, and supplying a drive current corresponding to one of the generated first and second control voltages to a laser diode to control intensity of the laser beam according to the selection mode.

13 Claims, 3 Drawing Sheets

APPARATUS AND METHOD OF CONTROLLING EMISSION OF LASER BEAM

CROSS-REFERENCE TO RELATED APPLICATIONS

This application claims the benefit under 35 U.S.C. §119 of Korean Patent Application No. 2005-39038, filed May 10, 2005, the disclosure of which is hereby incorporated herein by reference in its entirety.

BACKGROUND OF THE INVENTION

1. Field of the Invention

The present general inventive concept relates to an image forming apparatus and, more particularly, to an apparatus and method of controlling emission of a laser beam in a laser image forming apparatus.

2. Description of the Related Art

In general, a laser beam scanning device of a laser image forming apparatus forms an electrostatic latent image on a photosensitive drum by turning on/off a semiconductor laser so that the latent image is transferred to a recording medium to print a desired image.

A semiconductor laser control device, which should perform on/off switching operations of the semiconductor laser at a high speed in the laser beam scanning device of the laser image forming apparatus, includes a set of additional parts such as a driver IC, a resistor and a condenser, or a discrete circuit using a transistor.

A conventional apparatus for controlling emission of a laser beam in an image forming apparatus will be described in conjunction with FIG. 1.

FIG. 1 is a view of a conventional laser emission control apparatus for controlling emission of a laser beam in an image forming apparatus.

As shown in FIG. 1, the laser emission control apparatus includes a comparator 20, an optical power controller 30, a switch 40, a variable resistor 50, a reference voltage supply 60, and a laser emitter 70. In this process, the comparator 20 may be a NAND gate, and the optical power controller 30 may be an auto power controller (APC).

The switch 40 may be a transistor. The laser emitter 70 includes a laser diode LD for emitting a laser beam, and a photodiode PD for detecting intensity (voltage) of the laser beam emitted from the laser diode.

A specific operation of the laser emission control apparatus will be described.

First, the comparator 20 of the laser emission control apparatus shown in FIG. 1 compares a video reference voltage (video data control signal-A having a wave form B) with a control voltage (G). A value of the control voltage (G) is determined by a feedback voltage Vf that is proportional to the photodiode current E. The output of the comparator 20 is supplied to the optical power controller 30.

In this process, the control voltage (G) supplied to the comparator 20 is a difference between a reference potential VCC and the feedback voltage value Vf corresponding to a current E flowing through the photodiode PD (D) of the laser emitter 70. The feedback voltage Vf is essentially the potential difference across the variable resistor 50 and a resistor R1, when a current flows from the photodiode PD detecting that the laser is lit. The reference potential VCC provided from the reference voltage supply 60, is connected to the variable resistor 50 via the resistor R1. In this process, the resistor R1 is connected in series to the variable resistor 50 for preventing an excessive current due to a malfunction of the variable resistor 50. If the variable resistor 50 becomes almost zero, the excessive current may reach and damage the laser diode LD (C). The presence of the resistor R1 prevents the excessive current from being supplied in the case of a malfunction of the variable resistor 50.

When the laser diode LD (C) of the laser emitter 70 is turned "ON" by the optical power controller 30 of the semiconductor laser, a laser beam is emitted from the laser diode LD (C) and is detected by an optical detecting device, i.e., the photodiode PD (D).

Intensity of the laser beam detected by the photodiode PD (D) is determined by a potential regulated by the optical power controller 30. The comparator 20 compares the video reference voltage (video control signal A) with the control voltage (G). The result of the comparison is input to the optical power controller 30. In this process, the comparator 20 may be comprised of a NAND gate as described above.

According to the input value supplied by the comparator 20 within a range of high and low voltages, the optical power controller 30 provides an up counter value or a down counter value to a base terminal of a transistor of the switch 40. The output of the optical power controller 30 turns on the transistor so that the transistor allows a current to flow to the laser diode LD (C) of the laser emitter 70 to emit a laser beam.

That is, the current supplied to the laser diode LD (C) in the laser emitter 70 depends on the current value supplied to the base terminal of the transistor of the switch 40 from the optical power controller 30.

The output from the comparator 20 is supplied to the optical power controller 30 that, via the transistor 40, provides then an input current to the laser diode LD (C) of the laser emitter 70. The laser beam emitted by the laser diode due to the input current can be detected by the photodiode PD (D).

The control voltage (G) is controlled by a current E of the photodiode PD. The current E may be a feedback current. As shown in a loop of a broken line G, the control voltage (G) is feedback as an input to the comparator 20. The control voltage (G) is a voltage difference between a reference potential VCC provided from the reference voltage supply 60 and the voltage value corresponding to the current E from the photodiode PD (D) of the laser emitter 70 flowing across the variable resistor 50 and the resistor R1.

As shown in FIG. 1, the laser diode LD (C) of the laser emitter 70 is on/off controlled according to the input of the video control signal A. The latent image concentration should be reduced in comparison with an output image in a normal state when a laser printer is used in a toner save mode. Therefore, in the toner save mode, the video control signal A is transmitted from the optical power controller 30 to the transistor of the switch 40, for a time shorter than the on time for forming dots in a normal mode, of the laser diode LD (C).

In the case of the toner save mode, since the on time of the laser diode LD (C) is controlled for a time shorter than at least ¼ of that of the normal state, as shown in FIG. 1, the switching using the transistor 40 happens to a very high frequency and may malfunction. Therefore, concentration differences may occur due to differences between parts or transistors when the high speed frequency is input, and furthermore, there may be problems such as an empty white image, i.e., an image cannot be printed.

SUMMARY OF THE INVENTION

The present general inventive concept provides an apparatus and method of controlling emission of a laser beam in an image forming apparatus to minimize concentration differences in images to be printed by controlling intensity of the laser beam in a toner save mode.

Additional aspects and advantages of the present general inventive concept will be set forth in part in the description which follows and, in part, will be obvious from the description, or may be learned by practice of the general inventive concept.

The foregoing and/or other aspects of the present general inventive concept may be achieved by providing an apparatus to control emission of a laser beam used in an image forming apparatus including an input power supply to supply a plurality of input voltages; a switch to select one input voltage from the plurality of input voltages supplied from the input power supply according to a mode selection signal, a laser diode to emit a laser beam, and a laser emission controller to generate a control voltage according to the selected input voltage to control a the laser beam emission of the laser diode, and to supply a current to control the laser beam emission of the laser diode according to the generated control voltage.

The mode selection signal may be one of a normal mode selection signal and a toner save mode selection signal.

The input power supply includes a first reference power supply to supply a first reference voltage if the mode selection signal is a toner save mode selection signal, and a second reference power supply to supply a second reference voltage generated if the mode selection signal is a normal mode selection signal.

The first reference voltage may be higher than the second reference voltage. The first reference voltage may be 5 V, and the second reference voltage may be 3.3 V.

The laser emission controller may include a control voltage generator having a photodiode to detect an intensity of the laser beam of the laser diode, and a variable resistor connected to the photodiode and the switch in series, to generate the control voltage to control the laser emission. The control voltage value is a difference between the voltage supplied through the switch and a variable voltage across the variable resistor generated by receiving the current output from the photodiode according to the detected laser beam intensity. The laser emission controller may further include a comparator to compare the control voltage generated from the control voltage generator and a reference control voltage, and an optical power controller to provide a signal to control the laser emission of the laser diode according to the compared result of the comparator. In this process, the comparator may be a NAND gate.

The foregoing and other aspects of the present general inventive concept may also be achieved by providing a method of controlling emission of a laser beam used in an image forming apparatus including generating a plurality of input powers, supplying one input voltage of the plurality of input voltages according to a mode selection signal, and generating a control voltage to control emission of a laser beam of a laser diode according to the supplied input voltage and providing a current according to the generated control voltage to a laser diode.

The input power includes a first reference power supplied when a normal mode is selected, and a second reference power supplied when a toner save mode is selected.

The controlling of the laser emission includes connecting a photodiode to detect emission intensity of a laser beam to a variable resistor in series to generate the control voltage value to control the laser emission of the laser diode. The control value may be a voltage difference between the input voltage supplied through a user input mode selection signal and a variable voltage across the variable resistor due to the photodiode current output according to the detected laser beam intensity. The controlling of the laser emission may further include comparing the generated control voltage and a predetermined reference control voltage to provide a signal for controlling emission of the laser beam to a laser diode for generating the laser beam on the basis of the compared result.

The foregoing and other aspects of the present general inventive concept may also be achieved by providing a method of controlling emission of a laser beam used in an image forming apparatus including generating a first reference and a second reference voltage corresponding to a normal mode and a toner save mode, respectively, supplying one of the first and second reference voltages corresponding to a mode selection signal in a switching manner, generating a first control voltage and a second control voltage to control emission of the laser beam of a laser diode using one of the first and second reference voltages, respectively, and supplying drive current corresponding to one of the first control voltage and the second control voltage to the laser diode to control intensity of the laser beam according to the mode selection signal.

The reference voltage of the normal mode is lower than that of the toner save mode.

The foregoing and other aspects of the present general inventive concept may also be achieved by providing an apparatus a laser diode to control a laser beam, a photodiode to detect a laser beam, a power supply to provide a plurality of reference voltages according to user modes, respectively, a control voltage generator connected between the photodiode and the power supply to generate a plurality of control voltages according to the intensity of the laser beam and the plurality of voltages, and a laser intensity regulator to supply a first current to the laser diode according to the control voltages.

The foregoing and other aspects of the present general inventive concept may also be achieved by providing a method of controlling emission of a laser beam including emitting a laser beam by a laser diode, detecting the laser beam by a photodiode, supplying a plurality of reference voltages according to user modes, respectively, generating a plurality of control voltages according to the intensity of the laser beam and the plurality of voltages, and supplying a current to the laser based on a control voltage of the plurality of control voltages.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
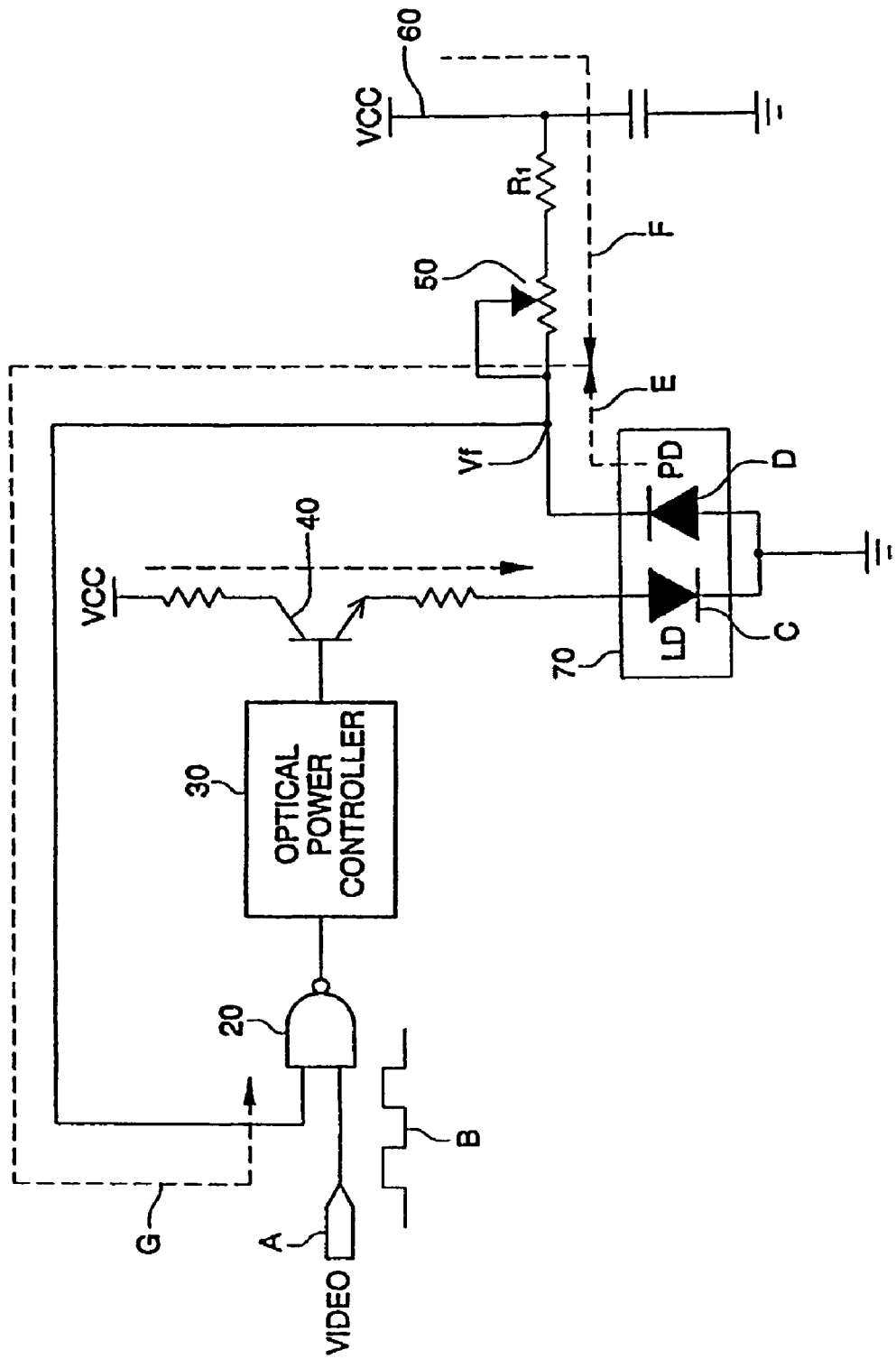
FIG. 1 is a schematic view of a conventional apparatus to control emission of a laser beam in an image forming apparatus.

Reference will now be made in detail to embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
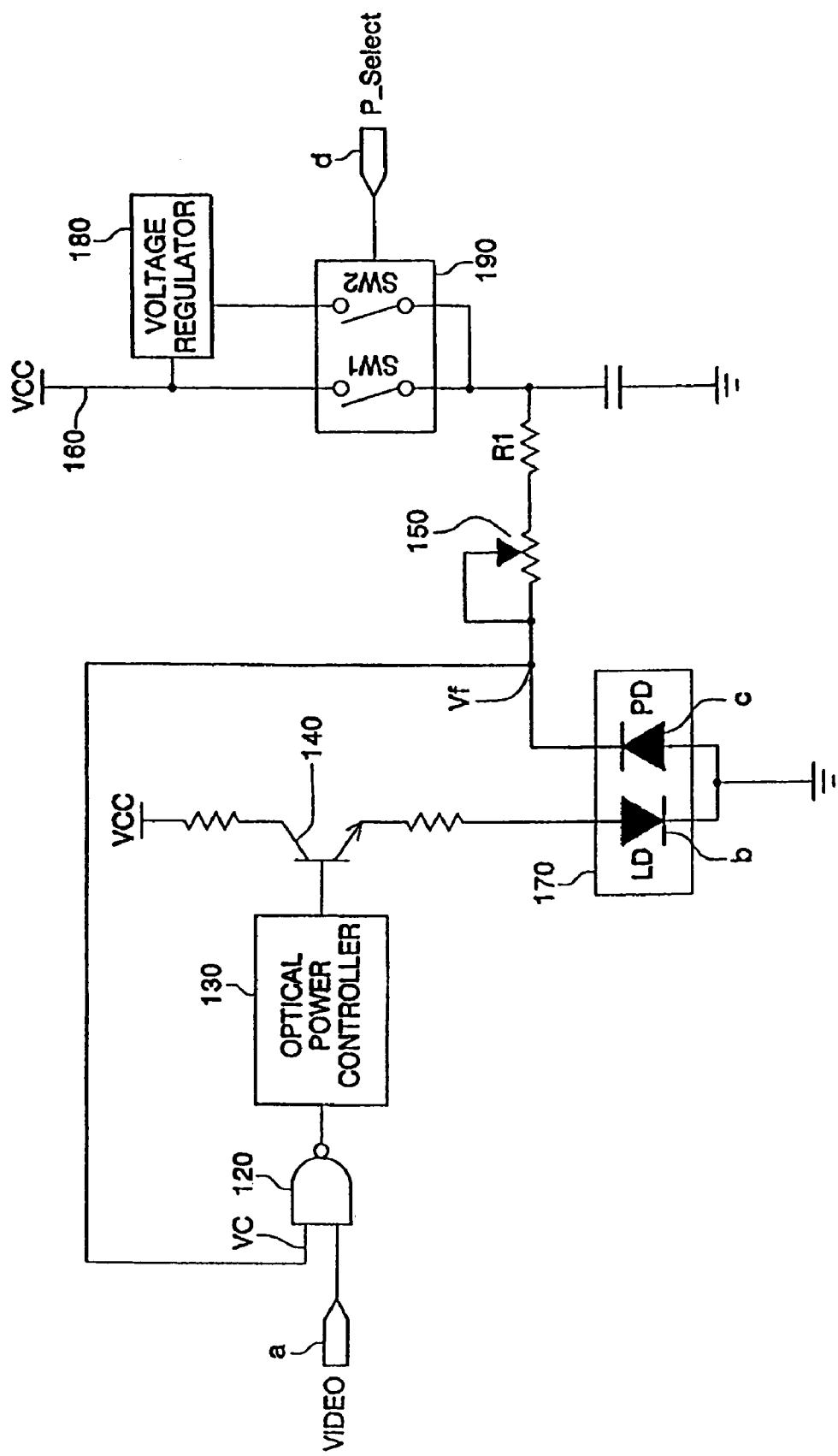
FIG. 2 is a schematic view of an apparatus to control emission of a laser beam in an image forming apparatus according to an embodiment of the present general inventive concept.

FIG. 2 is a schematic view of an apparatus to control emission of a laser beam in an image forming apparatus in accordance with the present general inventive concept, and the description of the same components as the conventional art shown in FIG. 1 will be omitted.

As shown in FIG. 2, the apparatus to control emission of a laser beam according to an embodiment of the present general inventive concept further includes a selection switch 190 and a voltage regulator 180. The switch 190 is connected to a variable resistor 150 and allows the user to select a normal mode and a toner save mode of functioning of the image forming apparatus. The switch 190 connects according to the mode selected a first reference potential VCC or a second reference potential supplied by the voltage regulator 180. According to the selection performed with the switch 190, the first reference potential or the second reference potential affects a control voltage supplied to a comparator 120. In this process, the second reference potential generated from the voltage regulator 180 is lower than the first reference potential VCC generated from a reference voltage supply 160. In the embodiment of the present general inventive concept, the first reference potential generated from the reference voltage supply 160 is VCC may be 5 V, and the second reference voltage generated from the voltage regulator 180 may be 3.3 V.

The selection switch 190 is a switch to switch selectively between the second reference potential VCC supplied to the resistors and the first reference potential generated from the voltage regulator 180.

An operation of the apparatus to control the emission of the laser beam according to an embodiment of the present general inventive concept will be described.

First, a high or low power selection signal is input to the selection switch 190 according to a user selection of a low or high signal. According to the user's selection a switch SW1 or a switch SW2 of the selection switch 190 connects the resistor R1 and the variable resistor 150 to the first reference potential VCC or the second reference potential supplied by the voltage regulator 180. For example, when the user selects a toner save mode, the switch SW1 of the selection switch 190 is turned "ON" to connect the first reference potential VCC to the resistor R1 and the variable resistor 150. When the user selects a normal mode, the switch SW2 is turned "ON" to connect the second reference potential supplied by the voltage regulator 180 to the resistor R1 and the variable resistor 150.

A feedback voltage Vf is equal to the first reference potential VCC, i.e., 5 V in the toner save mode and the second reference potential generated from the voltage regulator 180, i.e., 3.3 V in the normal mode when the laser is off.

The intensity of the laser beam emitted from the laser diode LD (b) of the laser emitter 170 is controlled by the control voltage VC. The control voltage is the difference between the first or second reference voltage and the feedback voltage Vf. When the laser is ON, the feedback voltage Vf is the product of the current from a photodiode PD multiplied with an equivalent resistance of the resistor R1 and the variable resistor 150. The control voltage and a video control signal input are input to the comparator 120. The output of the comparator 120 is supplied to the optical power controller 130 that turns on and off a semiconductor laser supply current, depending on the current applied to a base terminal of the transistor 140 that functions in this case like a switch. Hereinafter, the control voltage VC will be calculated through the following formulae.

First, when the resistance of the variable resistor 150 shown in FIG. 2 is 30 Kohm, the resistor R1 may be negligible compared to the variable resistor 150, a variable resistance Rc of the variable resistor 150 and the resistor R1, can be calculated using the following formula 1:

$Rc$=Variable resistance value (30 Kohm)/2=15 Kohm [Formula 1]

Meanwhile, the output current of the photodiode PD (c) detecting the laser beam emitted from the laser diode LD (b) is generally about 0.2 mA. Therefore, in the embodiment of the present general inventive concept, when the output current of the photodiode PD (c) is 0.2 mA, the feedback voltage Vf can be calculated using the following formula 2:

$Vf=Rc\times0.2$ mA=15 Kohm×0.2 mA=3V [Formula 2]

At this time, the control voltage VC input into the comparator 120 can be calculated using the following formula 3:

$VC=VCC-Vf$ [Formula 3]

When the image forming apparatus is in the normal mode according to the power selection signal d, the second reference voltage VCC2 is 3.3 V, supplied from the voltage regulator 180. When the toner save mode is selected, the first reference voltage VCC1 is 5 V.

Eventually, in the case of the toner save mode and the normal mode, the control voltages VC input into the comparator 120 can be calculated as the following formulae 4 and 5:

$Vc$ (Toner save mode)=$VCC-Vf$=5V−3V=2V [Formula 4]

$Vc$ (Normal mode)=$VCC-Vf$=3.3V−3V=0.3V [Formula 5]

As a result, in the toner save mode of the image forming apparatus, as calculated by the formulae, since the control voltage VC has a higher voltage value than the control voltage VC input into the comparator 120 in the normal mode, the intensity of the laser beam emitted from the laser diode LD (b) decreases. The current flowing through the laser diode LD (b) of the laser emitter 170 is lowered to a certain level.

Hereinafter, a method of controlling emission of a laser beam corresponding to the apparatus to control emission of a laser beam in accordance with the present general inventive concept will be described in conjunction with a flowchart.

Figure 3:
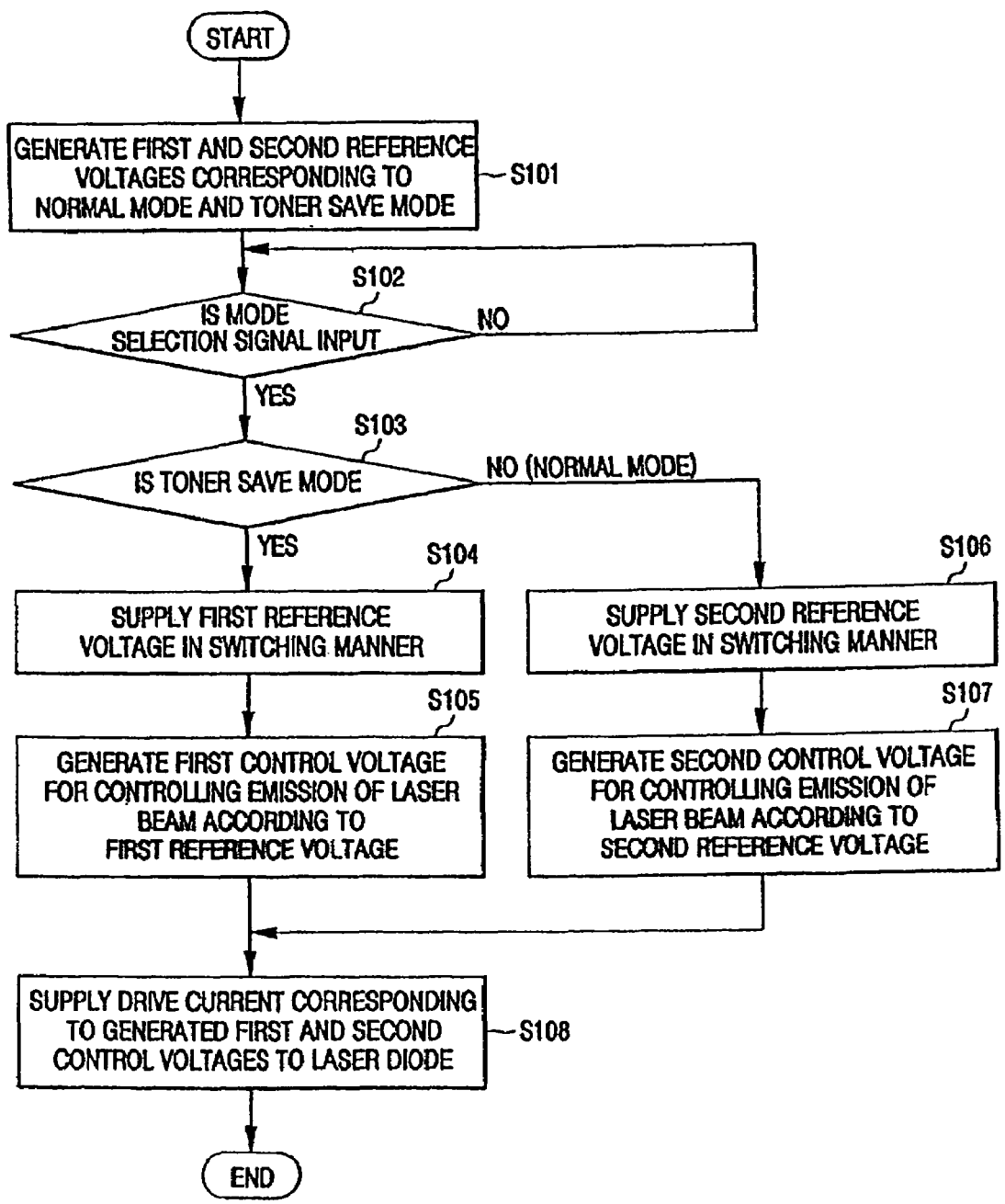
FIG. 3 is a flowchart illustrating a method of controlling emission of a laser beam in an image forming apparatus according to an embodiment of the present general inventive concept.

FIG. 3 is a flowchart illustrating a method of controlling emission of a laser beam in an image forming apparatus in accordance with the present general inventive concept.

As shown in FIG. 3, different input reference voltages, i.e., a first reference voltage and a second reference voltage, respectively corresponding to a normal mode and a toner save mode of the image forming apparatus are supplied (operation S101).

Then, it is determined whether user inputs a mode selection signal or not (operation S102). If the mode selection signal is input, it is determined whether the mode-selection signal is the toner save mode selection signal or the normal mode selection signal (operation S103).

If the mode selection signal is the toner save mode selection signal, the first reference voltage corresponding to the toner save mode of the different input voltages is supplied in a switching manner (operation S104). In this process, in the case of the toner save mode, the first reference voltage may be 5 V.

A first control voltage to control emission of the laser beam from the laser diode is generated in the toner save mode using the first reference voltage supplied in the switching manner (operation S105).

Meanwhile, if the mode selection is the normal mode selection signal (operation S103), the second reference voltage corresponding to the normal mode of the different input voltages is supplied in a switching manner (operation S106). In this process, the second reference voltage may be 3.3 V.

A second control voltage to control emission of the laser beam from the laser diode is generated in the normal mode using the second reference voltage supplied in the switching manner (operation S107).

According to the first and second control voltages of the respective modes generated in operation S105 and operation S107, the drive current is supplied to the laser diode to control the intensity of the laser beam emitted from the laser diode according to each mode (operation S108).

As can be seen from the foregoing, in the apparatus and method of controlling emission of a laser beam in the image forming apparatus in accordance with the present general inventive concept, the method includes: selecting a first reference voltage or a second reference voltage corresponding to a normal mode and a toner save mode; supplying one of the first and second reference voltages corresponding to a mode selection signal in a switching manner; generating first and second control voltages to control emission of the laser beam using one of the first and second reference voltages; and supplying drive current corresponding to one of the first and second control voltages to a laser diode to control intensity of the laser beam according to the selection mode. By using this method in the toner save mode, there are no image concentration differences associated with reducing the output image concentration.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An apparatus to control emission of a laser beam in a laser image forming apparatus, comprising:
   an input power supply to supply a plurality of input voltages according to a normal mode and a mode which saves toner selected by a user;
   a switch to select one input voltage from the plurality of input voltages supplied from the input power supply according to a mode selection signal indicating the normal mode and a mode which saves toner selected by the user;
   a laser diode to emit a laser beam; and
   a laser emission controller to generate a control voltage according to the selected input voltage to control a laser beam emission of the laser diode to a photosensitive drum of the laser image forming apparatus and to supply a current, for controlling the laser beam emission from the laser diode to the photosensitive drum according to the generated control voltage, to the laser diode so as to control an output image concentration.

2. The apparatus according to claim 1, wherein the input power supply comprises:
   a first reference power supply to supply a first reference voltage predetermined if the mode selection signal is a toner save mode selection signal; and
   a second reference power supply to supply a second reference voltage generated if the mode selection signal is a normal mode selection signal.

3. The apparatus according to claim 2, wherein the first reference voltage is higher than the second reference voltage.

4. The apparatus according to claim 2, wherein the first reference voltage is 5 V, and the second reference voltage is 3.3 V.

5. The apparatus according to claim 1, wherein the laser emission controller comprises:
   a control voltage generator having a photodiode to detect an intensity of the laser beam of the laser diode, and a variable resistor connected to the photodiode and the switch in series, to generate the control voltage to control the laser emission, according to a voltage difference between the voltage supplied through the switch and a variable voltage across the variable resistor generated by receiving the current output from the photodiode according to the detected laser beam intensity;
   a comparator to compare the control voltage generated from the control voltage generator with a reference control voltage; and
   an optical power controller to provide a signal to control the laser emission to the laser diode according to the compared result of the comparator.

6. The apparatus according to claim 5, wherein the comparator comprises a NAND gate.

7. A method of controlling emission of a laser beam in a laser image forming apparatus, the method comprising:
   generating a plurality of input voltages;
   supplying one input voltage of the plurality of input voltages according to a mode selection signal by a user corresponding to a normal mode and a mode which saves toner; and
   generating a control voltage to control emission of a laser beam from a laser diode to a photosensitive drum according to the supplied input voltage, and providing a current, for controlling the emission of a laser beam from the laser diode to the photosensitive drum according to the generated control voltage, to a laser diode so as to control an output image concentration.

8. The method according to claim 7, wherein the plurality of input voltages comprise a first reference voltage supplied when a toner save mode selection signal is provided, and a second reference voltage supplied when a normal mode selection signal is provided.

9. The method according to claim 8, wherein the first reference voltage is higher than the second reference voltage.

10. The method according to claim 8, wherein the first reference voltage is 5 V, and the second reference voltage is 3.3 V.

11. The method according to claim 7, wherein controlling the laser emission comprises:
   connecting a photodiode to detect emission intensity of the laser beam to a variable resistor in series and generating a control voltage value to control the laser emission of the laser diode as a voltage difference between the input voltage supplied according to a mode selection signal of a user and a variable voltage across the variable resistor generated by receiving the photodiode current output according to the detected laser beam intensity; and
   comparing the generated control voltage with a predetermined reference control voltage to provide a signal to control emission of the laser beam to a laser diode so that the laser beam is generated on the basis of the comparing result.

12. A method of controlling emission of a laser beam in a laser image forming apparatus, the method comprising:

generating a first reference voltage and a second reference voltage corresponding to a normal mode and a mode which saves toner selected by a user;

supplying one of the first reference voltage and second reference voltage corresponding to a mode selection signal in a switching manner when the normal mode and a mode which saves toner selected by a user is inputted;

generating a first control voltage or a second control voltage, for controlling emission of the laser beam from a laser diode to a photosensitive drum, using one of the first reference voltage and the second reference voltage;

supplying a driving current corresponding to one of the first reference voltage and the second reference voltage to the laser diode; and outputting a laser beam having corresponding emission to the photosensitive drum according to the supplied driving voltage.

13. The method according to claim 12, wherein the first reference voltage of the normal mode is lower than the second reference voltage of the toner save mode.

* * * * *